US010347544B2

(12) United States Patent
Dasgupta et al.

(10) Patent No.: US 10,347,544 B2
(45) Date of Patent: Jul. 9, 2019

(54) CO-PLANAR P-CHANNEL AND N-CHANNEL GALLIUM NITRIDE-BASED TRANSISTORS ON SILICON AND TECHNIQUES FOR FORMING SAME

(71) Applicant: INTEL CORPORATION, Santa Clara, CA (US)

(72) Inventors: Sansaptak Dasgupta, Hillsboro, OR (US); Han Wui Then, Portland, OR (US); Marko Radosavljevic, Portland, OR (US); Sanaz Gardner, Portland, OR (US); Seung Hoon Sung, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/774,446

(22) PCT Filed: Dec. 11, 2015

(86) PCT No.: PCT/US2015/065291
§ 371 (c)(1),
(2) Date: May 8, 2018

(87) PCT Pub. No.: WO2017/099797
PCT Pub. Date: Jun. 15, 2017

(65) Prior Publication Data
US 2018/0323106 A1 Nov. 8, 2018

(51) Int. Cl.
*H01L 21/82* (2006.01)
*H01L 21/8258* (2006.01)
(Continued)

(52) U.S. Cl.
CPC ...... *H01L 21/8258* (2013.01); *H01L 21/0243* (2013.01); *H01L 21/0254* (2013.01);
(Continued)

(58) Field of Classification Search
CPC ........... H01L 21/8258; H01L 21/02642; H01L 21/02381; H01L 21/0243; H01L 21/8252;
(Continued)

(56) References Cited

U.S. PATENT DOCUMENTS 5,681,766 A * 10/1997 Tserng ............... H01L 21/8252
148/DIG. 72
2001/0008299 A1 7/2001 Linthicum et al.
(Continued)

FOREIGN PATENT DOCUMENTS

WO 2015/047355 A1 4/2015
WO 2017/099797 A1 6/2017

OTHER PUBLICATIONS

International Search Report and Written Opinion received for PCT application No. PCT/US2015/065291, dated Aug. Aug. 18, 2016. 12 pages.
(Continued)

*Primary Examiner* — Kyoung Lee
*Assistant Examiner* — Christina A Sylvia
(74) *Attorney, Agent, or Firm* — Finch & Maloney PLLC

(57) ABSTRACT

Techniques are disclosed for fabricating co-planar p-channel and n-channel gallium nitride (GaN)-based transistors on silicon (Si). In accordance with some embodiments, a Si substrate may be patterned with recessed trenches located under corresponding openings formed in a dielectric layer over the substrate. Within each recessed trench, a stack including a buffer layer, a GaN or indium gallium nitride (InGaN) layer, and a polarization layer may be selectively formed, in accordance with some embodiments. The p-channel stack further may include another GaN or InGaN layer over its polarization layer, with source/drain (S/D) portions adjacent the m-plane or a-plane sidewalls of that GaN or InGaN layer. The n-channel may include S/D portions over
(Continued)

its GaN or InGaN layer, within its polarization layer, in accordance with some embodiments. Gate stack placement can be customized to provide any desired combination of enhancement and depletion modes for the resultant neighboring p-channel and n-channel transistor devices.

20 Claims, 8 Drawing Sheets

(51) Int. Cl.
| | |
|---|---|
| H01L 21/02 | (2006.01) |
| H01L 27/06 | (2006.01) |
| H01L 27/085 | (2006.01) |
| H01L 21/8252 | (2006.01) |
| H01L 29/66 | (2006.01) |
| H01L 29/778 | (2006.01) |
| H01L 27/092 | (2006.01) |
| H01L 29/08 | (2006.01) |
| H01L 29/423 | (2006.01) |
| H01L 29/04 | (2006.01) |
| H01L 29/20 | (2006.01) |

(52) U.S. Cl.
CPC .. *H01L 21/02381* (2013.01); *H01L 21/02458* (2013.01); *H01L 21/02488* (2013.01); *H01L 21/02505* (2013.01); *H01L 21/02639* (2013.01); *H01L 21/02642* (2013.01); *H01L 21/8252* (2013.01); *H01L 27/0605* (2013.01); *H01L 27/085* (2013.01); *H01L 27/092* (2013.01); *H01L 29/0847* (2013.01); *H01L 29/66462* (2013.01); *H01L 29/7781* (2013.01); *H01L 29/7786* (2013.01); H01L 21/0262 (2013.01); H01L 21/02631 (2013.01); H01L 29/045 (2013.01); H01L 29/2003 (2013.01); H01L 29/4236 (2013.01)

(58) Field of Classification Search
CPC ......... H01L 21/02458; H01L 21/02488; H01L 27/06; H01L 27/085; H01L 27/0605; H01L 27/092; H01L 27/02505; H01L 27/0254; H01L 27/02639; H01L 29/66462; H01L 29/7781; H01L 29/0847; H01L 29/4236; H01L 29/045; H01L 29/2003; H01L 29/7786
See application file for complete search history.

(56) References Cited

U.S. PATENT DOCUMENTS

| | | | |
|---|---|---|---|
| 2008/0073641 | A1 | 3/2008 | Cheng et al. |
| 2009/0121312 | A1 | 5/2009 | Chen et al. |
| 2010/0270591 | A1* | 10/2010 | Ahn .................. H01L 29/7782 257/194 |
| 2013/0337626 | A1 | 12/2013 | Briere |

OTHER PUBLICATIONS

International Preliminay Report on Patentability received for PCT application No. PCT/US2015/065291, dated Jun. 12, 2018. 7 pages.

* cited by examiner

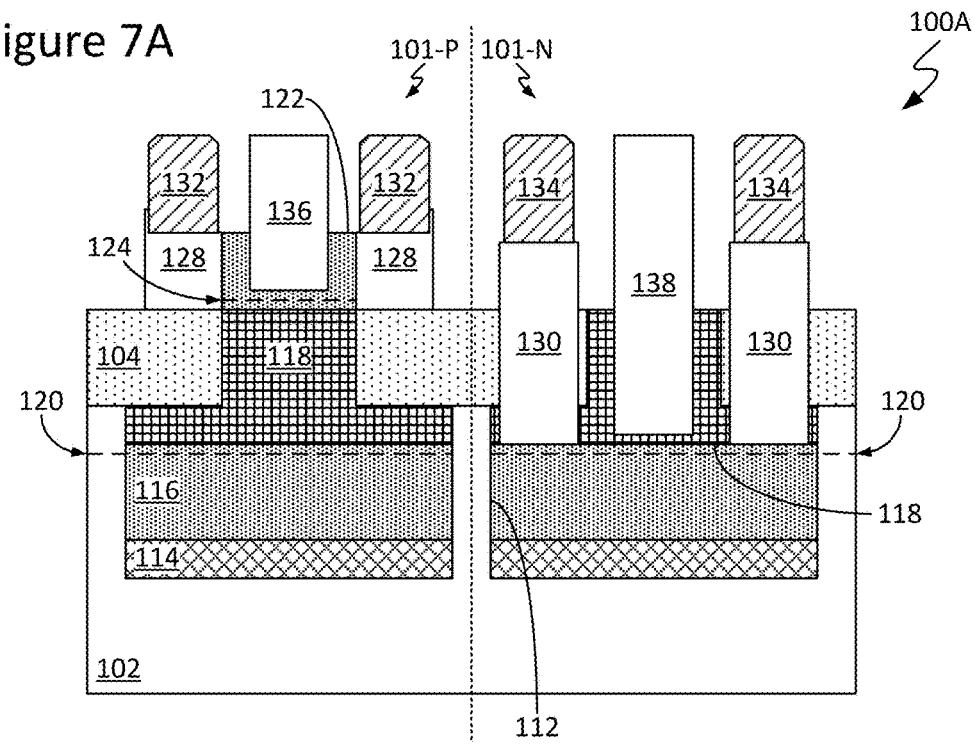
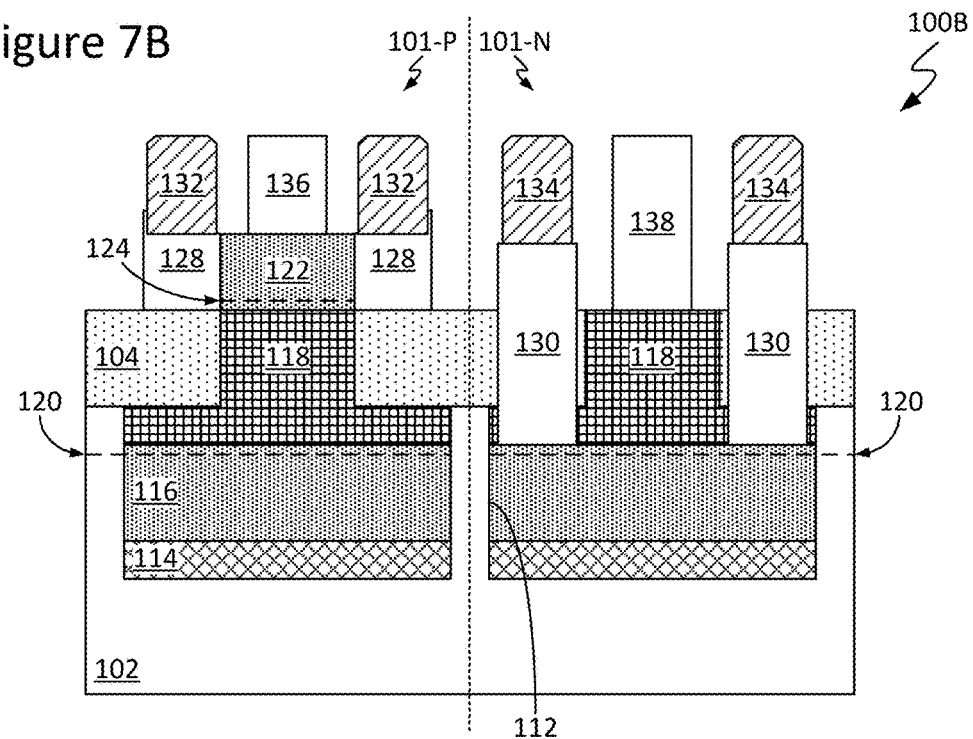

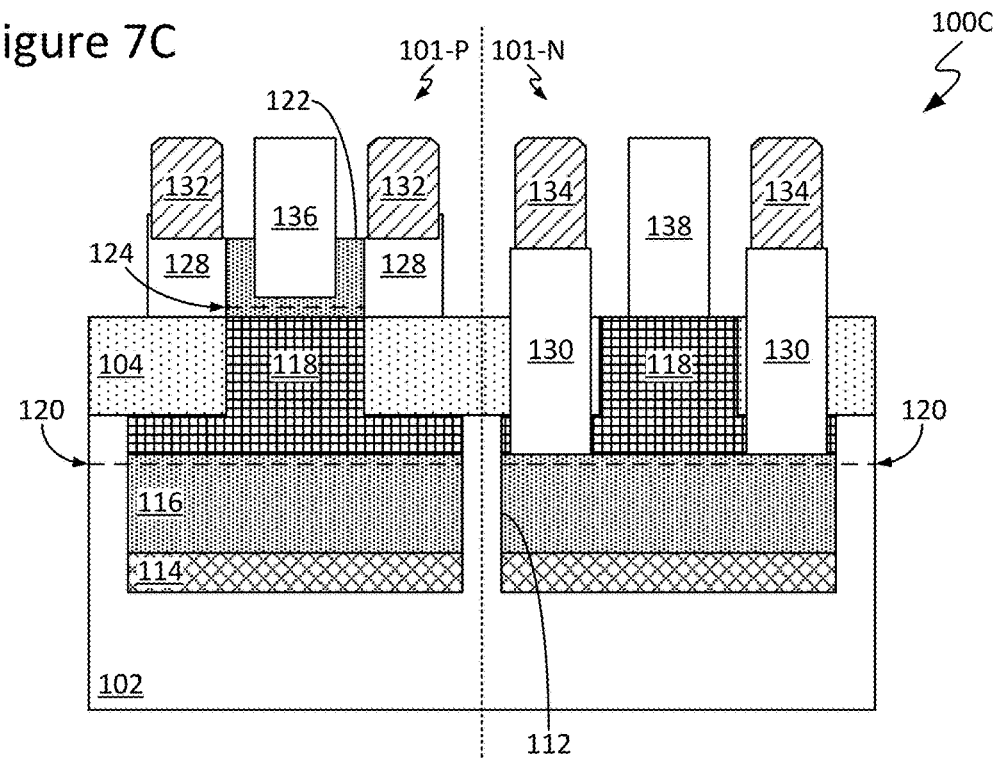
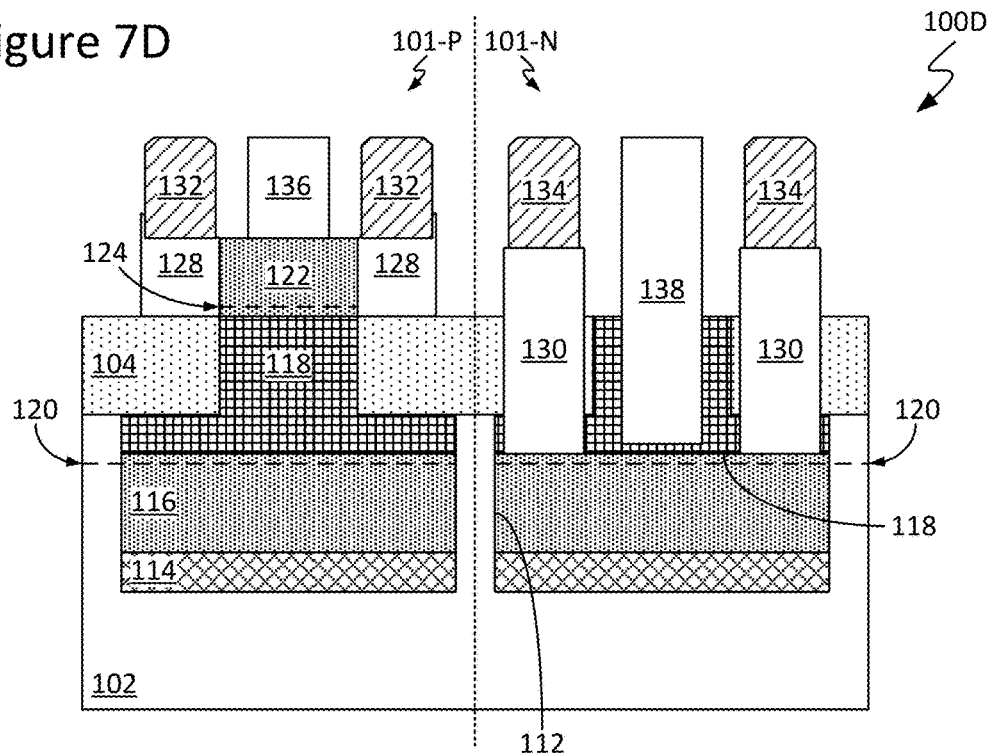

CO-PLANAR P-CHANNEL AND N-CHANNEL GALLIUM NITRIDE-BASED TRANSISTORS ON SILICON AND TECHNIQUES FOR FORMING SAME

BACKGROUND

Typical two-dimensional planar transistor architectures include a single silicon surface over which a gate is provided. A gate dielectric is normally provided between the gate and the underlying silicon. A source and a drain are normally provided adjacent the gate, over the silicon surface, which serves as the channel of the planar transistor.

BRIEF DESCRIPTION OF THE DRAWINGS

FIGS. 7A-7D illustrate several example ICs provided via the process flow of FIGS. 2-6, in accordance with some embodiments of the present disclosure.

Figure 1:
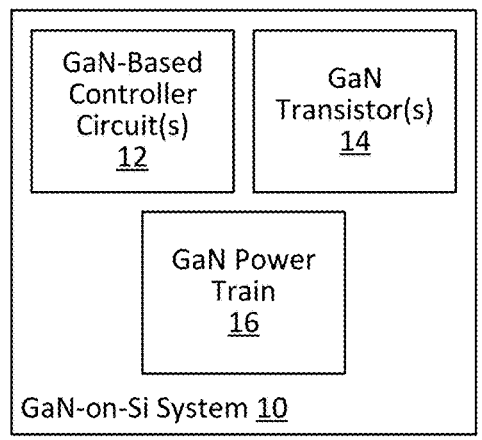
FIG. 1 is a block diagram illustrating an example gallium nitride-on-silicon (GaN-on-Si) system, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for fabricating co-planar p-channel and n-channel gallium nitride (GaN)-based transistors on silicon (Si). In accordance with some embodiments, a Si substrate may be patterned with recessed trenches or other features located under corresponding openings formed in a dielectric layer disposed over the substrate. Within each recessed feature, a stack including a buffer layer, a GaN or indium gallium nitride (InGaN) layer over the buffer layer, and a polarization layer over the GaN or InGaN layer may be selectively formed, in accordance with some embodiments. The stack for the p-channel transistor further may include another GaN or InGaN layer disposed over its polarization layer, and source/drain (S/D) portions may be disposed adjacent the m-plane or a-plane sidewalls of that GaN or InGaN layer, in accordance with some embodiments. For the n-channel transistor, S/D portions may be disposed over its GaN or InGaN layer, within its polarization layer, in accordance with some embodiments. Gate stack placement can be customized to provide any desired combination of enhancement and depletion modes for the resultant neighboring p-channel and n-channel transistor devices. Numerous configurations and variations will be apparent in light of this disclosure.

General Overview

Power management integrated circuits (PMICs) and other power delivery applications typically utilize logic and controller circuits that may benefit from the use of high-performance, low-leakage p-channel devices. Although gallium nitride (GaN) has very high bandgap and simultaneously high mobility thereby making n-channel GaN devices suitable for power delivery applications, power delivery and radio frequency (RF) communications applications further require logic circuitry and controller circuits that tend to work best when implemented with high-performance, low-leakage p-channel devices along with n-channel devices. However, p-channel GaN devices are not particularly adequate in this regard. Furthermore, co-integration of high-performance GaN transistors with silicon (Si) is complicated by their lattice mismatch (about 41%) and mismatch in coefficient of thermal expansion (about 116%), which would tend to produce high densities of threading dislocation defects, as well as surface cracks at upper active epitaxial layers that negatively impact the ability to fabricate quality GaN-on-Si devices. To this end, there are unresolved non-trivial issues.

Thus, and in accordance with some embodiments of the present disclosure, techniques are disclosed for fabricating co-planar p-channel and n-channel gallium nitride (GaN)-based transistors on silicon (Si). In accordance with some embodiments, a Si substrate may be patterned with recessed trenches or other features located under corresponding openings formed in a dielectric layer disposed over the substrate. Within each recessed feature, a stack including a buffer layer, a GaN or indium gallium nitride (InGaN) layer over the buffer layer, and a polarization layer over the GaN or InGaN layer may be selectively formed, in accordance with some embodiments. The stack for the p-channel transistor further may include another GaN or InGaN layer disposed over its polarization layer, and source/drain (S/D) portions may be disposed adjacent the m-plane or a-plane sidewalls of that GaN or InGaN layer, in accordance with some embodiments. For the n-channel transistor, S/D portions may be disposed over its GaN or InGaN layer, within its polarization layer, in accordance with some embodiments. Gate stack placement can be customized to provide any desired combination of enhancement and depletion modes for the resultant neighboring p-channel and n-channel transistor devices. As will be appreciated in light of this disclosure, numerous III-N transistor configurations can be implemented using GaN, aluminum nitride (AlN), indium nitride (InN), and compounds thereof. The recessed silicon effectively traps or otherwise reduces defects to provide a device-quality interface at the silicon/III-N interface.

In accordance with some embodiments, the disclosed techniques can be used, for example, to fabricate monolithic architectures including side-by-side, high-density GaN-on-Si or InGaN-on-Si p-channel and n-channel transistor devices on or in a single Si substrate. These architectures can be used in any of a wide range of high-voltage and high-frequency system-on-chip (SoC) applications, such as, for example, power management ICs (PMICs), integrated voltage regulators, and radio frequency (RF) power amplifiers and RF frontends, among others. In some cases, transistor architectures provided via the disclosed techniques can be utilized, for instance, for control logic circuits for integrated voltage regulators, as well as for on-board logic for switching on/off GaN-based light-emitting diodes (LEDs) and laser diodes, among other solid-state emitter devices. In a more general sense, the disclosed techniques can be used to fabricate high-performance GaN-based transistor devices that can be utilized, for example, in power management and communications for computing devices, mobile or otherwise (e.g., such as PCs, smartphones, and tablets, to name a few). Numerous suitable uses and applications will be apparent in light of this disclosure.

As will be appreciated in light of this disclosure, provision of neighboring co-planar p-channel and n-channel transistor devices via the disclosed techniques may serve to facilitate lithography processes and logic device formation. In some cases, devices fabricated via the disclosed techniques may exhibit improved breakdown voltages as compared to traditional device architectures. In some cases, the disclosed techniques can be used to fabricate GaN-based p-channel and n-channel transistors, for example, proximate a GaN-based power train in voltage regulators or RF power amplifiers, helping to minimize (or otherwise reduce) losses and permit package-level integration schemes.

In accordance with some embodiments, use of the disclosed techniques may be detected, for example, by any one, or combination, of scanning electron microscopy (SEM), transmission electron microscopy (TEM), chemical composition analysis, energy-dispersive X-ray (EDX) spectroscopy, and secondary ion mass spectrometry (SIMS) of a given IC or other semiconductor structure having co-planar p-channel and n-channel GaN-on-Si or InGaN-on-Si transistors configured as variously described herein. Any number of III-N-on-Si transistor configurations can be employed.

Methodology and Structure

FIG. 1 is a block diagram illustrating an example gallium nitride-on-silicon (GaN-on-Si) system 10, in accordance with an embodiment of the present disclosure. The example system 10 includes: GaN-based controller circuit(s) 12; GaN transistor(s) 14; and a GaN power train 16. As will be appreciated in light of this disclosure, these example elements can be utilized, for instance, to provide a fully integrated, GaN-based voltage regulator circuit on Si. The GaN-based controller circuits 12 of the integrated voltage regulators may utilize logic elements such as, for example, p-channel and n-channel GaN transistors 14. In accordance with some embodiments, the disclosed techniques can be utilized, for example, in fabrication of GaN-based controller circuit(s) 12, as well as GaN transistor(s) 14, among other IC devices.

Figure 10:
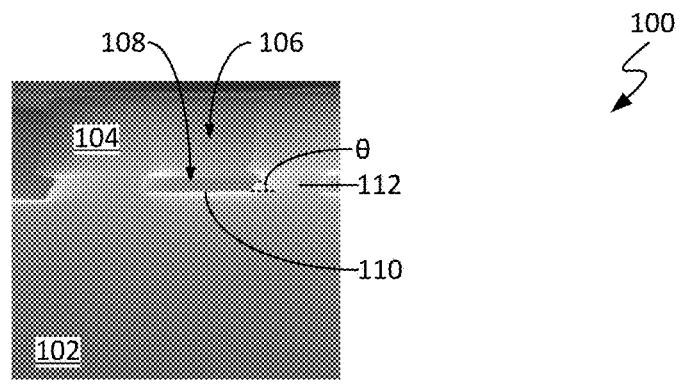
FIG. 10 is a cross-sectional image of a portion of an IC configured as in FIG. 2, in accordance with an embodiment of the present disclosure.

FIGS. 2-6 illustrate an integrated circuit (IC) fabrication process flow for forming an IC 100, in accordance with an embodiment of the present disclosure. The process may begin as in FIG. 2, which is a cross-sectional view of an integrated circuit (IC) 100 configured in accordance with an embodiment of the present disclosure. FIG. 10 is a cross-sectional image of a portion of an IC 100 configured as in FIG. 2, in accordance with an embodiment of the present disclosure. As can be seen, IC 100 includes a semiconductor substrate 102, which may have any of a wide range of configurations. For instance, semiconductor substrate 102 may be a bulk semiconductor substrate, a semiconductor-on-insulator (XOI, where X represents a semiconductor material) structure, a semiconductor wafer, or a multi-layered structure. Semiconductor substrate 102 may be formed from any one, or combination, of silicon (Si), germanium (Ge), and silicon-germanium (SiGe), among other semiconductor materials. In an example case, semiconductor substrate 102 may be formed, at least in part, from Si having a crystal orientation of <111>, hereinafter referred to as Si(111). Other suitable materials and configurations for semiconductor substrate 102 will depend on a given application and will be apparent in light of this disclosure.

IC 100 also includes a dielectric layer 104, which can be formed from any of a wide range of suitable dielectric material(s). For instance, in some cases, dielectric layer 104 may be formed from an oxide or carbon (C)-doped oxide, such as silicon dioxide ($SiO_2$), aluminum oxide ($Al_2O_3$), hafnium oxide ($HfO_2$), zirconium dioxide ($ZrO_2$), tantalum pentoxide ($Ta_2O_5$), titanium dioxide ($TiO_2$), or lanthanum oxide ($La_2O_3$). In other cases, dielectric layer 104 may be formed from a nitride, such as silicon nitride ($Si_3N_4$), and oxynitride, such as silicon oxynitride (SiON), or a carbide, such as silicon carbide (SiC). In other cases, dielectric layer 104 may be formed from a combination of any one or more of the aforementioned materials. In some cases, dielectric layer 104 may be configured to provide shallow trench isolation (STI) or otherwise serve as an inter-layer dielectric (ILD). Dielectric layer 104 can be formed over semiconductor substrate 102 via any suitable standard, custom, or proprietary technique(s), as will be apparent in light of this disclosure. The dimensions of dielectric layer 104 can be customized, as desired for a given target application or end-use. In some cases, dielectric layer 104 may have a thickness, for example, in the range of about 50-150 nm (e.g., about 50-100 nm, about 100-150 nm, or any other sub-range in the range of about 50-150 nm). It may be desirable, in some instances, to ensure that dielectric layer 104 is sufficiently thick so as to elevate the p-channel transistor device 101-P from the n-channel transistor device 101-N (each discussed below) to be fabricated. Other suitable materials, formation techniques, and dimensions for dielectric layer 104 will depend on a given application and will be apparent in light of this disclosure.

In accordance with some embodiments, dielectric layer 104 may be patterned with one or more openings 106, and underlying semiconductor substrate 102 may be patterned with one or more features 108. Patterning of openings 106 and features 108 may be performed via any suitable standard, custom, or proprietary lithography and etching technique(s), as will be apparent in light of this disclosure. In an example case, an anisotropic wet etch process may be employed in patterning features 108, and the etch chemistry can be customized based, at least in part, on the material composition of semiconductor layer 102. Other suitable techniques for patterning dielectric layer 104 and semiconductor substrate 102 will depend on a given application and will be apparent in light of this disclosure.

The dimensions and geometry of a given feature 108 can be customized, as desired for a given target application or end-use. In some cases, a given feature 108 may be configured, for instance, as a recessed trench (e.g., such as is generally depicted via FIG. 2). A given feature 108 may have a depth ($D_1$), for example, in the range of about 0.2-2 μm (e.g., about 0.2-0.5 μm, about 0.5-1.0 μm, about 1.0-1.5 μm, about 1.5-2.0 μm, or any other sub-range in the range of about 0.2-2 μm). It may be desirable, in some instances, to ensure that a given feature 108 is dimensioned to accommodate, for example, a buffer layer 114, a III-N semiconductor layer 116, and a polarization layer 118, each discussed below. Also, it may be desirable, in some instances, to ensure that the bottom surface 110 of a given feature 108 is substantially flat and smooth (e.g., within a given tolerance for a given target application or end-use) to provide smooth, recessed semiconductor surfaces over which the material stacks of p-channel transistor device 101-P and n-channel transistor device 101-N can be formed. The patterned semiconductor substrate 102, with its recessed trench feature(s) 108 underlying patterned dielectric layer 104, may facilitate provision of a substantially co-planar p-channel transistor device 101-P and n-channel transistor device 101-N, in accordance with some embodiments.

Figure 2:
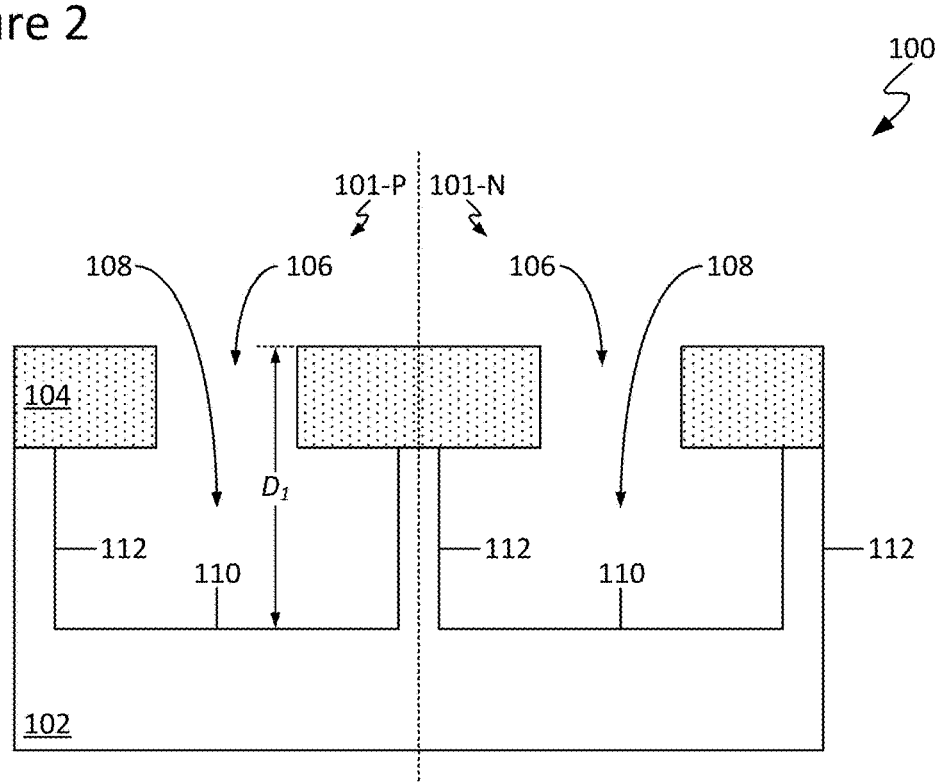
FIGS. 2-6 illustrate an integrated circuit (IC) fabrication process flow for forming an IC, in accordance with an embodiment of the present disclosure.

In patterning feature(s) 108, one or more semiconductor bodies 112 may remain extending from semiconductor substrate 102. In some cases, a given semiconductor body 112 may be, in a general sense, a fin-like prominence extending from the upper surface semiconductor substrate 102, such as is generally shown in FIG. 2. The dimensions of a given semiconductor body 112 may be customized, as desired for a given target application or end-use, and may depend, at least in part, on the particular dimensions of the adjacent features 108 associated therewith. In accordance with some embodiments, by virtue of the particular configuration of semiconductor substrate 102, a given semiconductor body 112 may serve to physically separate neighboring features 108, and thus neighboring p-channel transistor device 101-P and n-channel transistor device 101-N formed within those features 108, from one another. In some cases, sidewall portion(s) of a given semiconductor body 112 may be substantially perpendicular (e.g., within about 2°) to bottom surface 110 of semiconductor substrate 102. In some other cases, sidewall portion(s) of a given semiconductor body 112 may be slanted or otherwise extend from bottom surface 110 of semiconductor substrate 102 in a non-perpendicular manner. For instance, consider FIG. 10, which illustrates an example case in which sidewalls of a semiconductor body 112 are angled (e.g., θ less than 90°; θ more than 90°) with respect to bottom surface 110. The angling (if any) of a given sidewall portion can be customized, as desired.

In accordance with some embodiments, a given semiconductor body 112 optionally may be oxidized via any suitable standard, custom, or proprietary oxidation process(es), as will be apparent in light of this disclosure. Oxidation of a given semiconductor body 112 may provide for greater electrical isolation between p-channel transistor device 101-P and adjacent n-channel transistor device 101-N, improving $I_{OFF}$ and reducing the possibility of junction breakdown.

Figure 3:
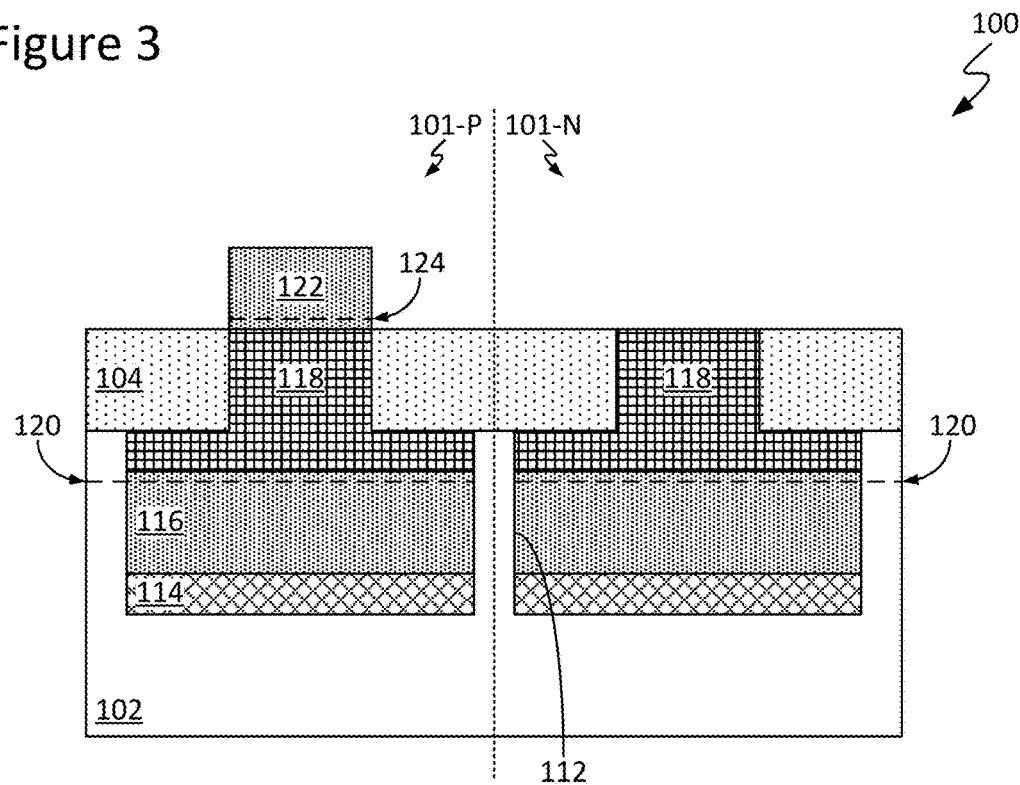
Figure 8:
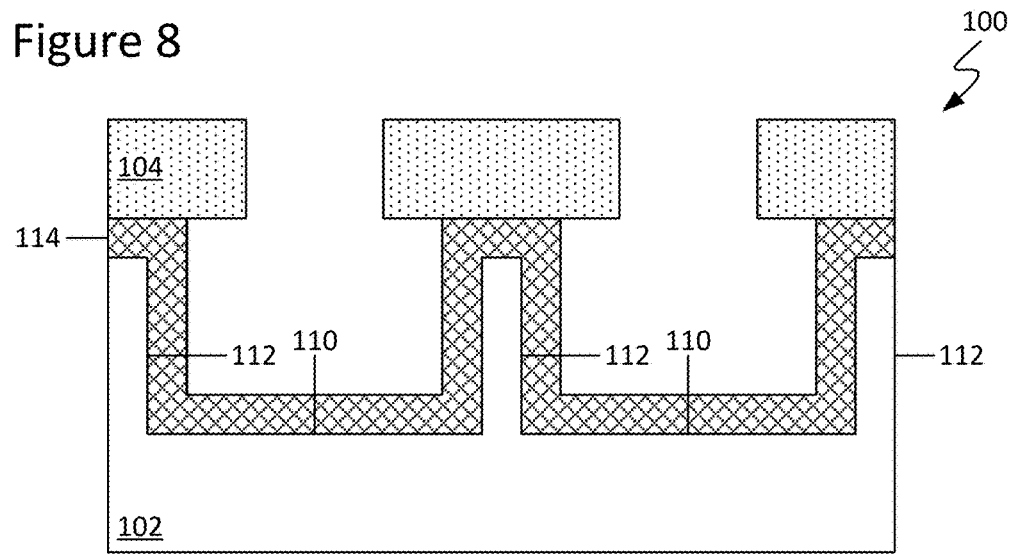
FIG. 8 illustrates a cross-sectional side view of an IC configured in accordance with another embodiment of the present disclosure.

The process may continue as in FIG. 3, which is a cross-sectional view of the IC 100 of FIG. 2 after forming a buffer layer 114, a III-N semiconductor layer 116, and a polarization layer 118 for each of p-channel transistor device 101-P and n-channel transistor device 101-N, as well as a III-N semiconductor layer 122 for p-channel transistor device 101-P, in accordance with an embodiment of the present disclosure. Buffer layer 114 can be formed from any of a wide range of materials, including any one, or combination, of: nitrides, such as aluminum nitride (AlN), aluminum gallium nitride (AlGaN), titanium nitride (TiN), and hafnium nitride (HfN); and oxides, such as titanium oxide (TiO) and hafnium oxide (HfO). Buffer layer 114 can be formed over semiconductor substrate 102 via any one, or combination, of a metal-organic chemical vapor deposition (MOCVD) process, a molecular beam epitaxy (MBE) process, an atomic layer deposition (ALD) process, or any other suitable standard, custom, or proprietary selective area deposition technique(s), as will be apparent in light of this disclosure. The thickness of buffer layer 114 can be customized, as desired for a given target application or end-use. In some cases, buffer layer 114 may have a thickness, for example, in the range of about 10-100 nm (e.g., about 10-50 nm, about 50-100 nm, or any other sub-range in the range of about 10-100 nm). In some embodiments, such as that generally shown via FIG. 3, buffer layer 114 may be formed over only bottom surface 110 of a given feature 108, extending only partially up the full height of a sidewall of an adjacent semiconductor body 112. In other embodiments, however, buffer layer 114 may be conformal to the sidewalls and top of one or more semiconductor bodies 112, as generally shown via FIG. 8, which illustrates a cross-sectional side view of an IC 100 configured in accordance with another embodiment of the present disclosure. Other suitable materials, formation techniques, and configurations for buffer layer 114 will depend on a given application and will be apparent in light of this disclosure.

III-N semiconductor layer 116 can be formed from any of a wide range of materials, including any one, or combination, of: gallium nitride (GaN); and indium gallium nitride (InGaN) (e.g., with an In concentration in the range of about 1-10% by weight). III-N semiconductor layer 116 can be formed over buffer layer 114 via any one, or combination, of a MOCVD process, an MBE process, or any other suitable standard, custom, or proprietary selective area deposition technique(s), as will be apparent in light of this disclosure. The thickness of III-N semiconductor layer 116 can be customized, as desired for a given target application or end-use. In some cases, III-N semiconductor layer 116 may have a thickness, for example, in the range of about 0.1-3 μm (e.g., about 0.1-1.0 μm, about 1.0-2.0 μm, about 2.0-3.0 μm, or any other sub-range in the range of about 0.1-3 μm). In some embodiments, such as that generally shown via FIG. 3, III-N semiconductor layer 116 may be formed over underlying buffer layer 114, within a given feature 108, extending only partially up the full height of a sidewall of an adjacent semiconductor body 112. It should be noted that III-N semiconductor layer 116 is not intended to be limited only to a layer-type configuration, as in some other instances, III-N semiconductor layer 116 may be provided with an island-like configuration. Other suitable materials, formation techniques, and configurations for III-N semiconductor layer 116 will depend on a given application and will be apparent in light of this disclosure.

Polarization layer 118 may be formed from any of a wide range of materials, including any one, or combination, of: aluminum indium nitride (AlInN) (e.g., having a concentration of about 82% Al and 18% In by weight); and aluminum gallium nitride (AlGaN) (e.g., having a concentration of about 30% Al and 70% Ga by weight). Polarization layer 118 can be formed over III-N semiconductor layer 116 via any one, or combination, of a MOCVD process, an MBE process, or any other suitable standard, custom, or proprietary selective area deposition technique(s), as will be apparent in light of this disclosure. The thickness of polarization layer 118 can be customized, as desired for a given target application or end-use. In some cases, polarization layer 118 may have a thickness, for example, in the range of about 10-30 nm (e.g., about 10-20 nm, about 20-30 nm, or any other sub-range in the range of about 10-30 nm). The geometry of polarization layer 118 may depend, at least in part, on the geometry of a given feature 108 in which it is formed (e.g., a first portion of polarization layer 118 may be wider than a second portion thereof, such as in the case of polarization layer 118 extending out from feature 108, up through a corresponding opening 106 in overhead dielectric layer 104). Other suitable materials, formation techniques, and configurations for polarization layer 118 will depend on a given application and will be apparent in light of this disclosure.

In some embodiments, an optional interface layer may be disposed between III-N semiconductor layer 116 and polarization layer 118. The optional interface layer may be, for example, aluminum nitride (AlN) or any other suitable interface material(s), as desired for a given target application or end-use. The optional interface layer can be formed using any suitable standard, custom, or proprietary technique(s), as will be apparent in light of this disclosure. The thickness of the optional interface layer can be customized, as desired for a given target application or end-use, and in some cases may be in the range of about 0.5-2 nm (e.g., about 0.5-1.0 nm, about 1.0-1.5 nm, about 1.5-2.0 nm, or any other sub-range in the range of about 0.5-2 nm). Other suitable materials, formation techniques, and dimensions for the optional interface layer will depend on a given application and will be apparent in light of this disclosure.

As can be seen further from FIG. 2, p-channel transistor device 101-P also includes a III-N semiconductor layer 122 over its polarization layer 118. III-N semiconductor layer 122 may be formed from any suitable III-N semiconductor material, as desired for a given target application or end-use. For instance, in some cases, III-N semiconductor layer 122 may be formed from any one, or combination, of gallium nitride (GaN) and indium gallium nitride (InGaN) (e.g., having an In concentration in the range of about 1-12% by weight). III-N semiconductor layer 122 can be formed using any suitable standard, custom, or proprietary technique(s), as will be apparent in light of this disclosure. For instance, in some cases, III-N semiconductor layer 122 may be formed using any one, or combination, of a CVD process such as an MOCVD process and an epitaxial process such as an MBE process. Polarization layer 118 of n-channel transistor device 101-N may be masked off to help prevent III-N semiconductor layer 122 from forming there over. The thickness of III-N semiconductor layer 122 can be customized, as desired for a given target application or end-use. In some cases, III-N semiconductor layer 122 may have a thickness, for example, in the range of about 5-25 nm (e.g., about 5-15 nm about 15-25 nm, or any other sub-range in the range of about 5-25 nm). It should be noted that III-N semiconductor layer 122 (or, for that matter, any other layer of IC 100) is not intended to be limited only to a layer-type configuration, as in some other instances, III-N semiconductor layer 122 (or other layer of IC 100) may be provided with an island-like configuration, including a single or a plurality of island structures of a given size and cross-sectional profile, as desired for a given target application or end-use. Other suitable materials, formation techniques, and configurations for III-N semiconductor layer 122 will depend on a given application and will be apparent in light of this disclosure.

As will be appreciated in light of this disclosure, gallium nitride (GaN), for example, has a wurtzite crystal structure and hence has polarization properties. Thus, if III-N semiconductor layer 116 is a GaN layer formed, for example, in the c-axis configuration, then the discontinuity in polarization between polarization layer 118 and III-N semiconductor layer 116 may result in the formation of a two-dimensional electron gas (2DEG) 116 at their interface (e.g., within III-N semiconductor layer 116). As will be further appreciated, 2DEG 120 may be, in a general sense, a gas of electrons that is free to move in two dimensions but tightly confined in a third dimension. In accordance with some embodiments, the n-channel transistor device 101-N may utilize 2DEG layer 120 induced at the bottom interface for its channel.

Similarly, if III-N semiconductor layer 122 is a GaN layer formed, for example, in the c-axis configuration, then the discontinuity in polarization between polarization layer 118 and III-N semiconductor layer 122 may result in the formation of a two-dimensional hole gas (2DHG) 124 at their interface (e.g., within III-N semiconductor layer 122). As will be further appreciated in light of this disclosure, 2DHG 124 may be, in a general sense, a gas of holes that is free to move in two dimensions but tightly confined in a third dimension. In accordance with some embodiments, p-channel transistor device 101-P may utilize 2DHG layer 124 induced at the top interface for its channel.

Figure 4:
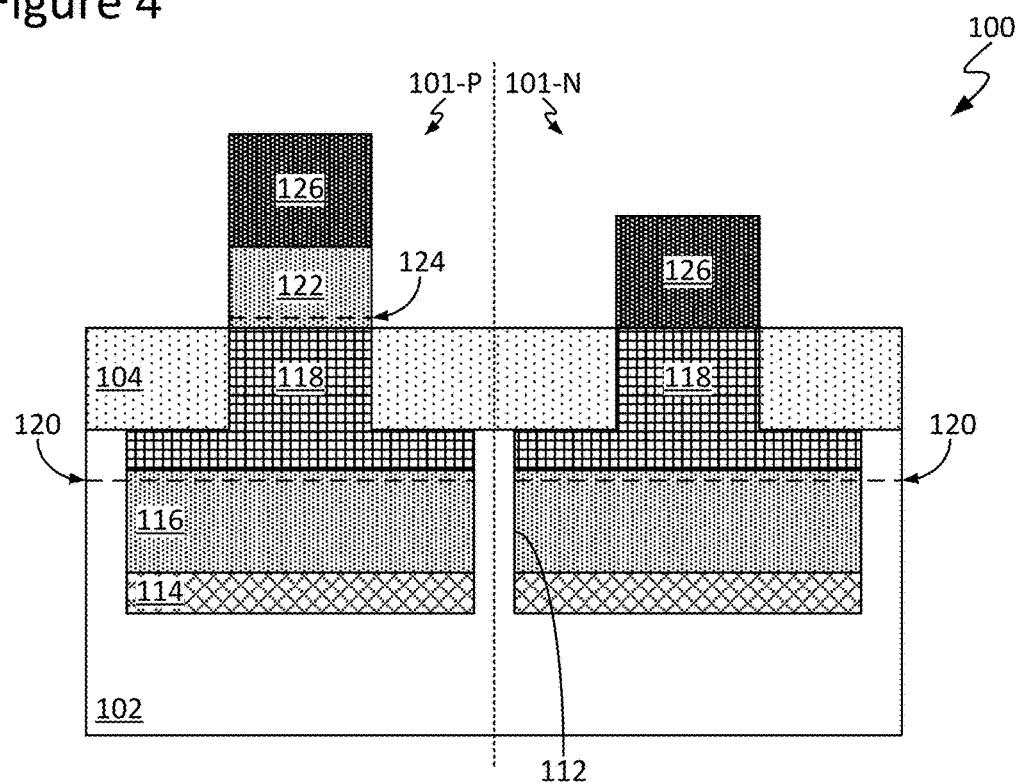

The process may continue as in FIG. 4, which is a cross-sectional view of the IC 100 of FIG. 3 after forming a hardmask layer 126 over IC 100, in accordance with an embodiment of the present disclosure. Hardmask layer 126 may be configured to protect portion(s) of IC 100 where no growth of source/drain (S/D) portions 128 (discussed below) is desired (e.g., on top of III-N semiconductor layer 122; on top of polarization layer 118 of n-channel transistor device 101-N). To that end, hardmask layer 126 may be formed any one, or combination, of a nitride, an oxide, and a metal, or any other suitable hardmask material(s), as will be apparent in light of this disclosure. Also, hardmask layer 126 can be formed using any suitable standard, custom, or proprietary formation technique(s), as will be apparent in light of this disclosure. Furthermore, the thickness of hardmask layer 126 can be customized, as desired for a given target application or end-use. Other suitable materials, formation techniques, and thicknesses for hardmask layer 126 will depend on a given application and will be apparent in light of this disclosure.

Figure 5:
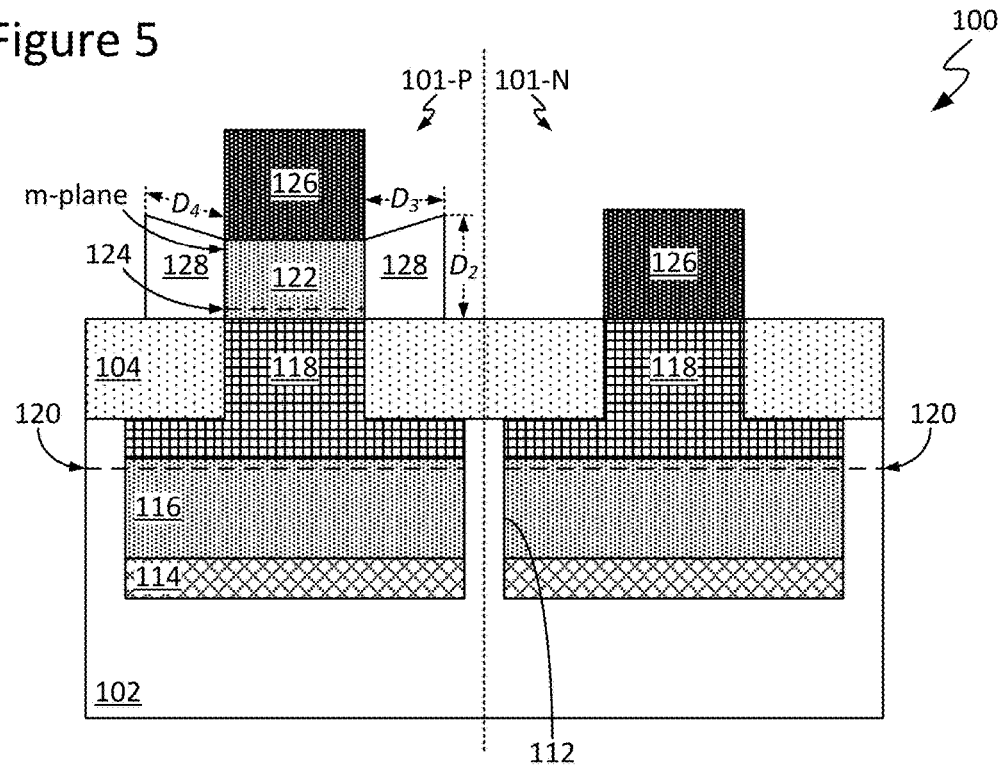

The process may continue as in FIG. 5, which is a cross-sectional view of the IC 100 of FIG. 4 after forming S/D portions 128 for p-channel transistor device 101-P, in accordance with an embodiment of the present disclosure. P-type S/D portions 128 can be formed from any suitable S/D material, as desired for a given target application or end-use. For instance, in some cases, p-type S/D portions 128 can be formed from any one, or combination, of gallium nitride (GaN), indium gallium nitride (InGaN), and silicon carbide (SiC). In some cases, p-type S/D portions 128 may be doped, for example, with magnesium (Mg). As will be appreciated in light of this disclosure, to ensure sufficient electronic contact, it may be desirable to provide sufficiently highly doped S/D portions 128, and the dopant concentration and doping profile can be customized to that end, as desired for a given target application or end-use.

P-type S/D portions 128 can be formed using any suitable standard, custom, or proprietary technique(s), as will be apparent in light of this disclosure. For instance, in some cases, p-type S/D portions 128 may be formed using any one, or combination, of a CVD process such as an MOCVD process and an epitaxial process such as an MBE process. The geometry and dimensions of a given p-type S/D portion 128 can be customized, as desired for a given target application or end-use. In some cases, a given p-type S/D portion 128 may have a height ($D_2$), for example, in the range of about 5-25 nm (e.g., about 5-15 nm, about 15-25 nm, or any other sub-range in the range of about 5-25 nm). In some cases, a given p-type S/D portion 128 may have a width ($D_3$), for example, in the range of about 50-100 nm (e.g., about 50-75 nm, about 75-100 nm, or any other sub-range in the range of about 50-100 nm). In some cases, a given p-type S/D portion 128 may have a slope length ($D_4$), for example, in the range of about 50-70 nm (e.g., about 50-60 nm, about 60-70 nm, or any other sub-range in the range of about 50-70 nm). Other suitable materials, formation techniques, and dimensions for p-type S/D portions 128 will depend on a given application and will be apparent in light of this disclosure.

Figure 9A:
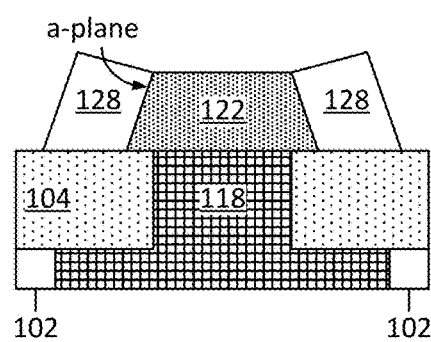
FIGS. 9A-9B illustrate partial cross-sectional side views of several ICs configured in accordance with some other embodiments of the present disclosure.
Figure 9B:
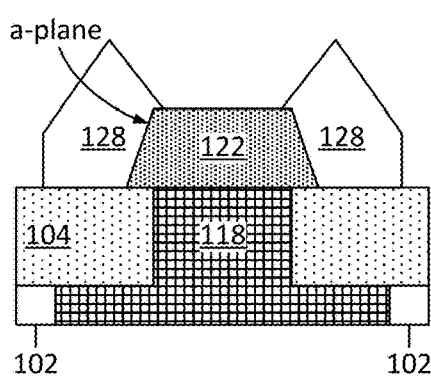

As can be seen from the figures, p-type S/D portions 128 may be formed on the sidewalls of III-N semiconductor layer 122, over dielectric layer 104. In some cases, p-type S/D portions 128 may be formed over the m-plane of III-N semiconductor layer 122, as generally shown by FIG. 5. In some other cases, p-type S/D portions 128 may be formed over the a-plane of III-N semiconductor layer 122, as generally shown by each of FIGS. 9A-9B, which illustrate partial cross-sectional side views of several ICs 100 configured in accordance with some other embodiments of the present disclosure.

In some instances, growth of p-type S/D portions 128 from the m-plane or the a-plane of III-N semiconductor layer 122 may result in hole concentrations of about 20× or greater for 2DHG 124 than in cases where a different facet/surface of III-N semiconductor layer 122 is selected. In some instances, growth of p-type S/D portions 128 from the m-plane or the a-plane of III-N semiconductor layer 122 may result in greater p-type dopant concentrations (e.g., about 20× or more) than in cases where a different facet/surface of III-N semiconductor layer 122 is selected. Higher dopant incorporation may result in lower channel contact resistance, which can help to realize a good logic transistor for $I_{ON}$. Also, in the m-plane or a-plane of III-N semiconductor layer 122, the acceptor activation energy may be reduced as compared to other planes thereof. Furthermore, dielectric layer 104 may provide electronic isolation of p-type S/D portions 128, III-N semiconductor layer 122 (e.g., the p-channel), and 2DHG 124 from III-N semiconductor layer 118 (e.g., the n-channel) and 2DEG 120, allowing for a low $I_{OFF}$ for the p-channel transistor device 101-P, which can help to realize a good logic transistor for $I_{OFF}$.

Figure 6:
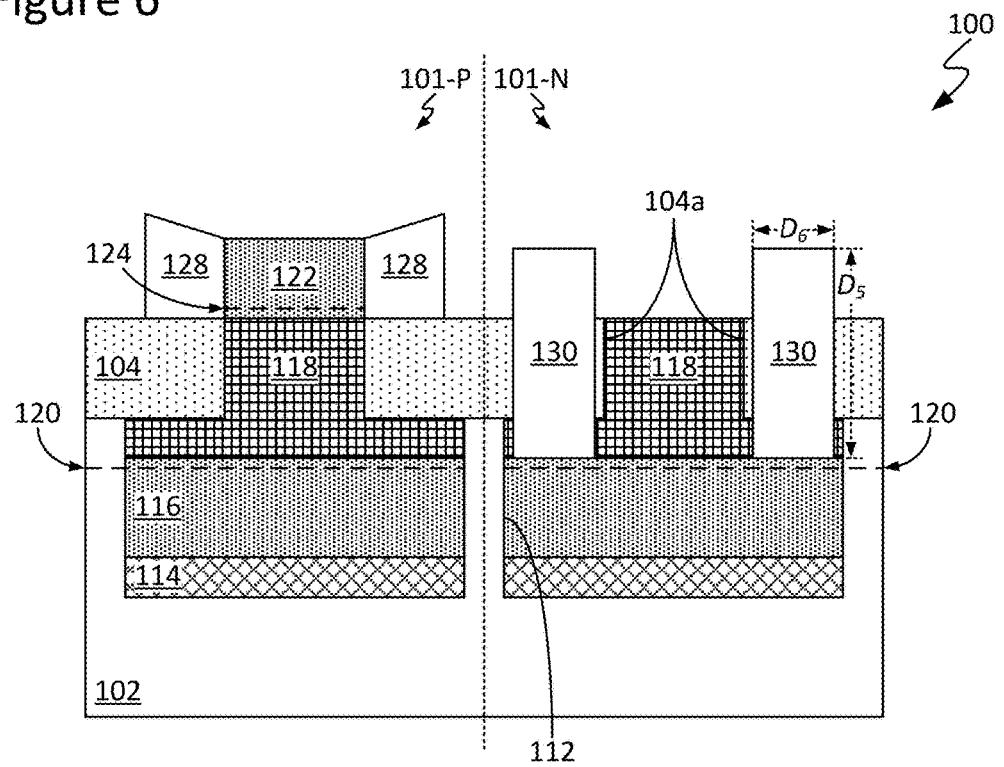
Figure 11:
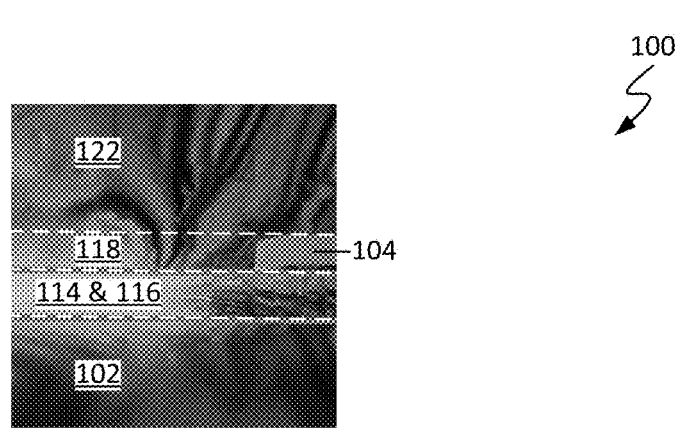
FIG. 11 is a cross-sectional image of a portion of an IC configured as in FIG. 6, in accordance with an embodiment of the present disclosure.

The process may continue as in FIG. 6, which is a cross-sectional view of the IC 100 of FIG. 5 after removing hardmask layer 126 and forming n-type S/D portions 130, in accordance with an embodiment of the present disclosure. FIG. 11 is a cross-sectional image of a portion of an IC 100 configured as in FIG. 6, in accordance with an embodiment of the present disclosure. Portions of dielectric layer 104 and polarization layer 118 of n-channel transistor device 101-N may be removed, and n-type S/D portions 130 may be formed within the resultant openings. N-type S/D portions 130 can be formed from any suitable S/D material, as desired for a given target application or end-use. For instance, in some cases, n-type S/D portions 130 can be formed from any one, or combination, of gallium nitride (GaN) and indium gallium nitride (InGaN). In some cases, n-type S/D portions 130 may be doped, for example, with silicon (Si). As will be appreciated in light of this disclosure, to ensure sufficient electronic contact, it may be desirable to provide sufficiently highly doped S/D portions 130, and the dopant concentration and doping profile can be customized to that end, as desired for a given target application or end-use.

N-type S/D portions 130 can be formed using any suitable standard, custom, or proprietary technique(s), as will be apparent in light of this disclosure. For instance, in some cases, n-type S/D portions 130 may be formed using any one, or combination, of a CVD process such as an MOCVD process and an epitaxial process such as an MBE process. The geometry and dimensions of a given n-type S/D portion 130 can be customized, as desired for a given target application or end-use. In some cases, a given n-type S/D portion 130 may have a height ($D_5$), for example, in the range of about 50-200 nm (e.g., about 50-125 nm, about 125-200 nm, or any other sub-range in the range of about 50-200 nm). In some cases, a given n-type S/D portion 130 may have a width ($D_6$), for example, in the range of about 50-300 nm (e.g., about 50-175 nm, about 175-300 nm, or any other sub-range in the range of about 50-300 nm). Other suitable materials, formation techniques, and dimensions for n-type S/D portions 130 will depend on a given application and will be apparent in light of this disclosure.

As can be seen further from FIG. 6, dielectric layer 104 may be configured to provide underfill isolation between p-type S/D portions 128 of p-channel transistor device 101-P and polarization layer 118 (e.g., the n-channel) of n-channel transistor device 101-N, in accordance with some embodiments. In some embodiments, dielectric layer 104 may be configured to serve, at least in part, as a spacer 104a between polarization layer 118 and n-type S/D portions 130 for n-channel transistor device 101-N.

Figure 12:
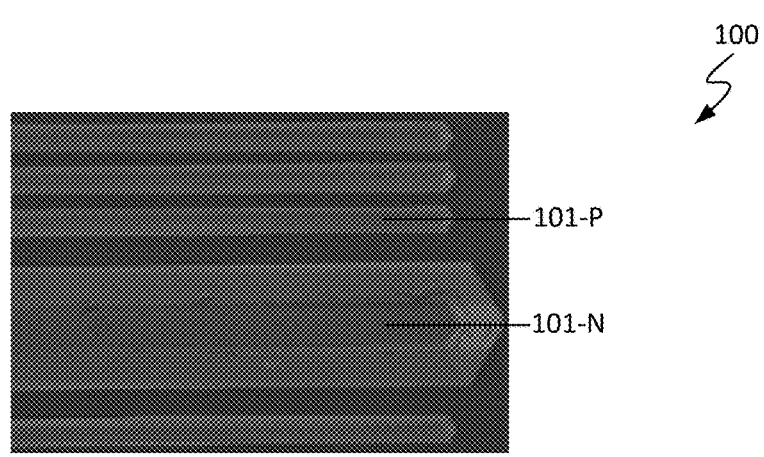
FIG. 12 is a top-down perspective image of an IC configured in accordance with an embodiment of the present disclosure.

At this point in the process flow of FIGS. 2-6, IC 100 may include most (or all) of the various material stacks for the fabrication of a p-type transistor device 101-P (e.g., GaN PMOS device) and a neighboring n-type transistor device 101-N (e.g., GaN NMOS device), both formed over a commonly shared semiconductor substrate 102 (e.g., Si substrate) patterned with one or more semiconductor bodies 112 (e.g., fin-like prominences). For instance, consider FIG. 12, which is a top-down perspective image of an IC 100 configured in accordance with an embodiment of the present disclosure. Further processing may be performed, for example, to include additional layer(s), as desired for a given target application or end-use. For instance, consider FIGS. 7A-7D, which illustrate several example ICs 100A-100D provided via the process flow of FIGS. 2-6, in accordance with some embodiments of the present disclosure. For consistency and ease of understanding of the present disclosure, ICs 100A-100D may be collectively referred to herein generally as an IC 100, except where separately enumerated. Other suitable uses of the process flow of FIGS. 2-6 will be apparent in light of this disclosure.

In accordance with some embodiments, the process flow of FIGS. 2-6 may continue with forming S/D contacts 132 for p-channel transistor device 101-P and S/D contacts 134 for n-channel transistor device 101-N. In accordance with some embodiments, S/D contacts 132 may be configured to provide ohmic contact to underlying p-type S/D portions 128 (e.g., providing p-ohmic contact to GaN S/D portions 128), and S/D contacts 134 may be configured to provide ohmic contact to underlying n-type S/D portions 130 (e.g., providing n-ohmic contact to GaN S/D portions 130). To these ends, S/D contacts 132 and 134 can be formed from any suitable electrically conductive material(s), as will be apparent in light of this disclosure. For instance, in some cases, S/D contacts 132 of p-channel transistor device 101-P may be formed from any one, or combination, of nickel (Ni), gold (Au), and platinum (Pt). In some cases, S/D contacts 134 of n-channel transistor device 101-N may be formed from any one, or combination, of titanium (Ti), aluminum (Al), and tungsten (W). The dimensions of S/D contacts 132 and 134 can be customized, as desired for a given target application or end-use. Also, S/D contacts 132 and 134 can be formed using any suitable standard, custom, or proprietary technique(s), as will be apparent in light of this disclosure. Other suitable materials, formation techniques, and configurations for S/D contacts 132 and 134 will depend on a given application and will be apparent in light of this disclosure.

In accordance with some embodiments, the process flow of FIGS. 2-6 may continue with forming a gate stack 136 for p-channel transistor device 101-P and a gate stack 138 for n-channel transistor device 101-N. Gate stacks 136 and 138 each may include a gate and a gate dielectric layer (e.g., disposed between the gate and an underlying layer). The gate and gate dielectric layer of a given gate stack 136 or gate stack 138 may be formed from any suitable gate and gate dielectric material(s), respectively. For instance, in some cases, the gate dielectric layer of each of gate stacks 136 and 138 may be formed from any one, or combination, of high-κ dielectric materials, such as aluminum oxide ($Al_2O_3$), hafnium oxide ($HfO_2$), silicon dioxide ($SiO_2$), silicon nitride ($Si_3N_4$), and zirconium dioxide ($ZrO_2$), among others. In some cases, the gate of gate stack 136 may be formed from any one, or combination, of metals or metal nitrides, such as titanium (Ti), aluminum (Al), and titanium nitride (TiN), among others. In some cases, the gate of gate stack 138 may be formed from any one, or combination, of metals or metal nitrides, such as nickel (Ni), gold (Au), platinum (Pt), and titanium nitride (TiN), among others. Gate stacks 136 and 138 can be formed via any suitable standard, custom, or proprietary technique(s), as will be apparent in light of this disclosure. Also, the dimensions of each gate stack 136 and 138 can be customized, as desired for a given target application or end-use. In some cases, the gate dielectric layer of gate stacks 136 and 138 may have a thickness, for example, in the range of about 1-5 nm (e.g., about 1-2.5 nm, about 2.5-5.0 nm, or any other sub-range in the range of about 1-5 nm). Other suitable materials, formation techniques, and dimensions for gate stacks 136 and 138 will depend on a given application and will be apparent in light of this disclosure.

The placement of gate stacks 136 and 138 can be customized, as desired for a given target application or end-use, and numerous suitable configurations will be apparent in light of this disclosure. FIG. 7A illustrates a cross-sectional view of an IC 100A configured in accordance with another embodiment of the present disclosure. As can be seen there, (1) gate stack 136 of p-channel transistor device 101-P may be disposed within III-N semiconductor layer 122, over polarization layer 118, and (2) gate stack 138 of n-channel transistor device 101-N may be disposed within polarization layer 118, over III-N semiconductor layer 116. In such instances, p-channel transistor device 101-P may be considered to be configured for p-channel enhancement mode, and n-channel transistor device 101-N may be considered to be configured for n-channel enhancement mode.

FIG. 7B illustrates a cross-sectional view of an IC 100B configured in accordance with another embodiment of the present disclosure. As can be seen there, (1) gate stack 136 of p-channel transistor device 101-P may be disposed over III-N semiconductor layer 122, and (2) gate stack 138 of n-channel transistor device 101B may be disposed over polarization layer 118. In such instances, p-channel transistor device 101-P may be considered to be configured for p-channel depletion mode, and n-channel transistor device 101-N may be considered to be configured for n-channel depletion mode.

FIG. 7C illustrates a cross-sectional view of an IC 100C configured in accordance with another embodiment of the present disclosure. As can be seen there, (1) gate stack 136 of p-channel transistor device 101A may be disposed within III-N semiconductor layer 122, over polarization layer 118, and (2) gate stack 138 of n-channel transistor device 101B may be disposed over polarization layer 118. In such instances, p-channel transistor device 101-P may be considered to be configured for p-channel enhancement mode, and n-channel transistor device 101-N may be considered to be configured for n-channel depletion mode. FIG. 7D illustrates a cross-sectional view of an IC 100D configured in accordance with another embodiment of the present disclosure. As can be seen there, (1) gate stack 136 of p-channel transistor device 101A may be disposed over III-N semiconductor layer 122, and (2) gate stack 138 of n-channel transistor device 101B may be disposed within polarization layer 118, over III-N semiconductor layer 116. In such instances, p-channel transistor device 101-P may be considered to be configured for p-channel depletion mode, and n-channel transistor device 101-N may be considered to be configured for n-channel enhancement mode.

As can be seen from FIGS. 7A-7D, in some cases, gate stack 136 and S/D contacts 132 may be substantially co-planar with each other (e.g., so that their top surfaces are substantially in the same plane), and gate stack 138 and S/D contacts 134 may also be substantially co-planar with each other. In some instances, co-planarity may be provided for all (or any sub-set) of those elements of IC 100, such as the case where the top surfaces of gate stack 136, S/D contacts 132, gate stack 138, and S/D contacts 134 are substantially in the same plane. The present disclosure is not intended to be so limited, however, and in accordance with other embodiments, any one, or combination, of gate stack 136, gate stack 138, S/D contacts 132, and S/D contacts 134 may be of different height(s) with respect to one another. In a more general sense, the particular arrangement of gate stacks 136 and 138 and S/D contacts 132 and 134 can be customized, as desired for a given target application or end-use, and co-planarity thereof optionally may be provided.

Example System

Figure 13:
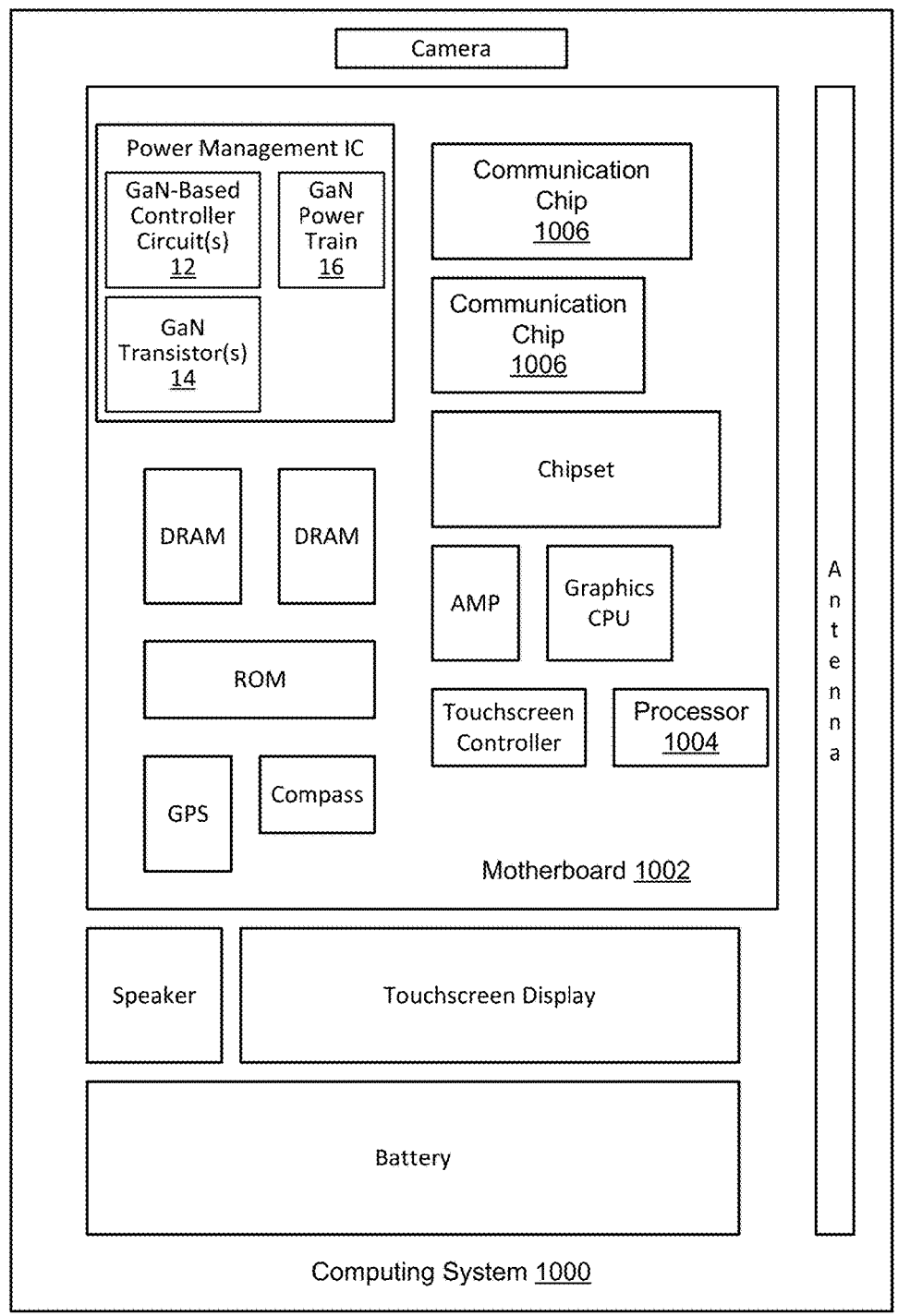
FIG. 13 illustrates a computing system implemented with IC structures or devices formed using the disclosed techniques in accordance with an example embodiment.

FIG. 13 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

Computing system 1000 further may include a power management integrated circuit (PMIC), which may include any one or more of the elements discussed above with respect to GaN-on-Si system 10 in FIG. 1. In some cases, the PMIC may be, for example, a voltage controller chip. The PMIC may be a stand-alone component on the motherboard or it may be integrated, in part or in whole, with processor 1004, as desired for a given target application or end-use. Numerous configurations and variations will be apparent in light of this disclosure.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a semiconductor substrate; an n-type transistor at least one of over and in the semiconductor substrate and including: a first buffer layer disposed over the semiconductor substrate; a first III-N semiconductor layer disposed over the first buffer layer; and a first polarization layer disposed over the first III-N semiconductor layer; and a p-type transistor at least one of over and in the semiconductor substrate, adjacent to the n-type transistor, and including: a second buffer layer disposed over the semiconductor substrate; a second III-N semiconductor layer disposed over the second buffer layer; a second polarization layer disposed over the second III-N semiconductor layer, wherein at least a portion of the second polarization layer is co-planar with at least a portion of the first polarization layer; and a third III-N semiconductor layer disposed over the second polarization layer.

Example 2 includes the subject matter of any of Examples 1 and 3-17, wherein the first, second, and third III-N semiconductor layers each include at least one of gallium nitride (GaN) and indium gallium nitride (InGaN).

Example 3 includes the subject matter of any of Examples 1-2 and 4-17 and further includes n-type source/drain (S/D) portions disposed over the first III-N semiconductor layer and extending through the first polarization layer; S/D contacts disposed over the n-type S/D portions; p-type S/D portions extending from sidewalls of the third III-N semiconductor layer; and S/D contacts disposed over the p-type S/D portions.

Example 4 includes the subject matter of Example 3, wherein the n-type S/D portions: include at least one of gallium nitride (GaN) and indium gallium nitride (InGaN); and are doped with silicon (Si).

Example 5 includes the subject matter of Example 3, wherein the p-type S/D portions: include at least one of gallium nitride (GaN), indium gallium nitride (InGaN), and silicon carbide (SiC); and are doped with magnesium (Mg).

Example 6 includes the subject matter of Example 3, wherein: the S/D contacts disposed over the n-type S/D portions include at least one of titanium (Ti), aluminum (Al), and tungsten (W); and the S/D contacts disposed over the p-type S/D portions include at least one of nickel (Ni), gold (Au), and platinum (Pt).

Example 7 includes the subject matter of any of Examples 1-6 and 9-17, wherein the p-type S/D portions extend from m-plane sidewalls of the third III-N semiconductor layer.

Example 8 includes the subject matter of any of Examples 1-6 and 9-17, wherein the p-type S/D portions extend from a-plane sidewalls of the third III-N semiconductor layer.

Example 9 includes the subject matter of any of Examples 1-8 and 10-17 and further includes a first gate stack disposed over the first III-N semiconductor layer; and a second gate stack disposed over the second III-N semiconductor layer; wherein either: the first gate stack is disposed within the first polarization layer, and the second gate stack is disposed within the third III-N semiconductor layer; the first gate stack is disposed over the first polarization layer, and the second gate stack is disposed over the third III-N semiconductor layer; the first gate stack is disposed over the first polarization layer, and the second gate stack is disposed within the third III-N semiconductor layer; or the first gate stack is disposed within the first polarization layer, and the second gate stack is disposed over the third III-N semiconductor layer.

Example 10 includes the subject matter of any of Examples 1-9 and 11-17, wherein the first and second buffer layers each: include at least one of aluminum nitride (AlN), aluminum gallium nitride (AlGaN), titanium nitride (TiN), hafnium nitride (HfN), titanium oxide (TiO), and hafnium oxide (HfO); and have a thickness in the range of about 10-100 nm.

Example 11 includes the subject matter of any of Examples 1-10 and 12-17, wherein the first and second buffer layers together constitute a single, unitary layer that is conformal to the semi conductor substrate.

Example 12 includes the subject matter of any of Examples 1-11 and 13-17, wherein the first and second polarization layers each: include at least one of aluminum indium nitride (AlInN) and aluminum gallium nitride (AlGaN); and have a thickness in the range of about 10-30 nm.

Example 13 includes the subject matter of any of Examples 1-12 and 14-17 and further includes a first interface layer disposed between the first III-N semiconductor layer and the first polarization layer; and a second interface layer disposed between the second III-N semiconductor layer and the second polarization layer.

Example 14 includes the subject matter of Example 13, wherein the first and second interface layers each: include aluminum nitride (AlN); and have a thickness in the range of about 0.5-2 nm.

Example 15 includes the subject matter of any of Examples 1-14 and 16-17, wherein the first III-N semiconductor layer and the first polarization layer interface such that a two-dimensional electron gas (2DEG) exists at their interface, and the n-channel transistor device is configured to use the 2DEG as its channel; and the second polarization layer and the third III-N semiconductor layer interface such that a two-dimensional hole gas (2DHG) exists at their interface, and the p-channel transistor device is configured to use the 2DHG as its channel.

Example 16 includes the subject matter of any of Examples 1-15 and 17, wherein the semiconductor substrate includes silicon (Si).

Example 17 includes the subject matter of any of Examples 1-16, wherein the semiconductor substrate includes silicon (Si) having a crystal orientation of <111>.

Example 18 is an integrated circuit including: a semiconductor substrate; a dielectric layer disposed over the semiconductor substrate; first and second features disposed in the semiconductor substrate, under corresponding first and second openings disposed in the dielectric layer, wherein: the first and second openings are narrower in width than the first and second features, respectively; and the first and second features are separated by a portion of the semiconductor substrate; an n-channel transistor device including: a first buffer layer disposed over the semiconductor substrate, within the first feature; a first III-N semiconductor layer disposed over the first buffer layer, within the first feature; and a first polarization layer disposed over the first III-N semiconductor layer, within the first feature and extending through the first opening such that at least a portion of the first polarization layer is co-planar with an upper surface of the dielectric layer; and a p-channel transistor device including: a second buffer layer disposed over the semiconductor substrate, within the second feature; a second III-N semiconductor layer disposed over the second buffer layer, within the second feature; a second polarization layer disposed over the second III-N semiconductor layer, within the second feature and extending through the second opening such that at least a portion of the second polarization layer is co-planar with the upper surface of the dielectric layer; and a third III-N semiconductor layer disposed over the at least a portion of the second polarization layer that is co-planar with the upper surface of the dielectric layer.

Example 19 includes the subject matter of any of Examples 18 and 20-38, wherein the first, second, and third III-N semiconductor layers each include at least one of gallium nitride (GaN) and indium gallium nitride (InGaN).

Example 20 includes the subject matter of any of Examples 18-19 and 21-38, wherein: the first and second III-N semiconductor layers each have a thickness in the range of about 0.1-3 μm; and the third III-N semiconductor layer has a thickness in the range of about 5-25 nm.

Example 21 includes the subject matter of any of Examples 18-20 and 22-38 and further includes: n-type source/drain (S/D) portions disposed over the first III-N semiconductor layer and extending through the first polarization layer and the dielectric layer; S/D contacts disposed over the n-type S/D portions; p-type S/D portions disposed over the dielectric layer, extending from sidewalls of the third III-N semiconductor layer; and S/D contacts disposed over the p-type S/D portions.

Example 22 includes the subject matter of Example 21, wherein the n-type S/D portions: include at least one of gallium nitride (GaN) and indium gallium nitride (InGaN); and are doped with silicon (Si).

Example 23 includes the subject matter of Example 21, wherein the p-type S/D portions: include at least one of gallium nitride (GaN), indium gallium nitride (InGaN), and silicon carbide (SiC); and are doped with magnesium (Mg).

Example 24 includes the subject matter of Example 21, wherein: the S/D contacts disposed over the n-type S/D portions include at least one of titanium (Ti), aluminum (Al), and tungsten (W); and the S/D contacts disposed over the p-type S/D portions include at least one of nickel (Ni), gold (Au), and platinum (Pt).

Example 25 includes the subject matter of Example 21, wherein the dielectric layer physically separates the n-type S/D portions from the at least a portion of the first polarization layer that is co-planar with the upper surface of the dielectric layer.

Example 26 includes the subject matter of any of Examples 18-25 and 28-38, wherein the p-type S/D portions extend from m-plane sidewalls of the third III-N semiconductor layer.

Example 27 includes the subject matter of any of Examples 18-25 and 28-38, wherein the p-type S/D portions extend from a-plane sidewalls of the third III-N semiconductor layer.

Example 28 includes the subject matter of any of Examples 18-27 and 29-38 and further includes: a first gate stack disposed over the first III-N semiconductor layer; and a second gate stack disposed over the second III-N semiconductor layer; wherein either: the first gate stack is disposed within the first polarization layer, and the second gate stack is disposed within the third III-N semiconductor layer; the first gate stack is disposed over the first polarization layer, and the second gate stack is disposed over the third III-N semiconductor layer; the first gate stack is disposed over the first polarization layer, and the second gate stack is disposed within the third III-N semiconductor layer; or the first gate stack is disposed within the first polarization layer, and the second gate stack is disposed over the third III-N semiconductor layer.

Example 29 includes the subject matter of any of Examples 18-28 and 30-38, wherein the first and second buffer layers each: include at least one of aluminum nitride (AlN), aluminum gallium nitride (AlGaN), titanium nitride (TiN), hafnium nitride (HfN), titanium oxide (TiO), and hafnium oxide (HfO); and have a thickness in the range of about 10-100 nm.

Example 30 includes the subject matter of any of Examples 18-29 and 31-38, wherein the first and second buffer layers together constitute a single, unitary layer that is conformal to the first and second features and the portion of the semiconductor substrate that separates the first and second features.

Example 31 includes the subject matter of any of Examples 18-30 and 32-38, wherein the first and second polarization layers each: include at least one of aluminum indium nitride (AlInN) and aluminum gallium nitride (AlGaN); and have a thickness in the range of about 10-30 nm.

Example 32 includes the subject matter of any of Examples 18-31 and 33-38 and further includes: a first interface layer disposed between the first III-N semiconductor layer and the first polarization layer; and a second interface layer disposed between the second III-N semiconductor layer and the second polarization layer.

Example 33 includes the subject matter of Example 32, wherein the first and second interface layers each: include aluminum nitride (AlN); and have a thickness in the range of about 0.5-2 nm.

Example 34 includes the subject matter of any of Examples 18-33 and 35-38, wherein the dielectric layer: includes at least one of silicon dioxide ($SiO_2$), aluminum oxide ($Al_2O_3$), hafnium oxide ($HfO_2$), zirconium dioxide ($ZrO_2$), tantalum pentoxide ($Ta_2O_5$), titanium dioxide ($TiO_2$), lanthanum oxide ($La_2O_3$), silicon nitride ($Si_3N_4$), silicon oxynitride (SiON), and silicon carbide (SiC); and has a thickness in the range of about 50-150 nm.

Example 35 includes the subject matter of any of Examples 18-34 and 36-38, wherein: the first III-N semiconductor layer and the first polarization layer interface such that a two-dimensional electron gas (2DEG) exists at their interface, and the n-channel transistor device is configured to use the 2DEG as its channel; and the second polarization layer and the third III-N semiconductor layer interface such that a two-dimensional hole gas (2DHG) exists at their interface, and the p-channel transistor device is configured to use the 2DHG as its channel.

Example 36 includes the subject matter of any of Examples 18-35 and 37-38, wherein the semiconductor substrate includes silicon (Si).

Example 37 includes the subject matter of any of Examples 18-36 and 38, wherein the semiconductor substrate includes silicon (Si) having a crystal orientation of <111>.

Example 38 includes the subject matter of any of Examples 18-37, wherein the portion of the semiconductor substrate that separates the first and second features at least one of: is oxidized; and has a sidewall portion that is slanted with respect to a bottom surface of at least one of the first and second features.

Example 39 is a method of fabricating an integrated circuit, the method including: providing a semiconductor substrate; providing a dielectric layer disposed over the semiconductor substrate; providing first and second features disposed in the semiconductor substrate, under corresponding first and second openings disposed in the dielectric layer, wherein: the first and second openings are narrower in width than the first and second features, respectively; and the first and second features are separated by a portion of the semiconductor substrate; providing an n-channel transistor device including: a first buffer layer disposed over the semiconductor substrate, within the first feature; a first III-N semiconductor layer disposed over the first buffer layer, within the first feature; and a first polarization layer disposed over the first III-N semiconductor layer, within the first feature and extending through the first opening such that at least a portion of the first polarization layer is co-planar with an upper surface of the dielectric layer; and providing a p-channel transistor device including: a second buffer layer disposed over the semiconductor substrate, within the second feature; a second III-N semiconductor layer disposed over the second buffer layer, within the second feature; a second polarization layer disposed over the second III-N semiconductor layer, within the second feature and extending through the second opening such that at least a portion of the second polarization layer is co-planar with the upper surface of the dielectric layer; and a third III-N semiconductor layer disposed over the at least a portion of the second polarization layer that is co-planar with the upper surface of the dielectric layer.

Example 40 includes the subject matter of any of Examples 39 and 41-59, wherein the first, second, and third III-N semiconductor layers each include at least one of gallium nitride (GaN) and indium gallium nitride (InGaN).

Example 41 includes the subject matter of any of Examples 39-40 and 42-59, wherein the first and second III-N semiconductor layers each have a thickness in the range of about 0.1-3 µm; and the third III-N semiconductor layer has a thickness in the range of about 5-25 nm.

Example 42 includes the subject matter of any of Examples 39-41 and 43-59 and further includes: providing n-type source/drain (S/D) portions disposed over the first III-N semiconductor layer and extending through the first polarization layer and the dielectric layer; providing S/D contacts disposed over the n-type S/D portions; providing p-type S/D portions disposed over the dielectric layer, extending from sidewalls of the third III-N semiconductor layer; and providing S/D contacts disposed over the p-type S/D portions.

Example 43 includes the subject matter of Example 42, wherein the n-type S/D portions: include at least one of gallium nitride (GaN) and indium gallium nitride (InGaN); and are doped with silicon (Si).

Example 44 includes the subject matter of Example 42, wherein the p-type S/D portions: include at least one of gallium nitride (GaN), indium gallium nitride (InGaN), and silicon carbide (SiC); and are doped with magnesium (Mg).

Example 45 includes the subject matter of Example 42, wherein the S/D contacts disposed over the n-type S/D portions include at least one of titanium (Ti), aluminum (Al), and tungsten (W); and the S/D contacts disposed over the p-type S/D portions include at least one of nickel (Ni), gold (Au), and platinum (Pt).

Example 46 includes the subject matter of Example 42, wherein the dielectric layer physically separates the n-type S/D portions from the at least a portion of the first polarization layer that is co-planar with the upper surface of the dielectric layer.

Example 47 includes the subject matter of Example 42, wherein the p-type S/D portions extend from m-plane sidewalls of the third III-N semiconductor layer.

Example 48 includes the subject matter of Example 42, wherein the p-type S/D portions extend from a-plane sidewalls of the third III-N semiconductor layer.

Example 49 includes the subject matter of any of Examples 39-48 and 50-59 and further includes providing a first gate stack disposed over the first III-N semiconductor layer; and providing a second gate stack disposed over the second III-N semiconductor layer; wherein either: the first gate stack is disposed within the first polarization layer, and the second gate stack is disposed within the third III-N semiconductor layer; the first gate stack is disposed over the first polarization layer, and the second gate stack is disposed over the third III-N semiconductor layer; the first gate stack is disposed over the first polarization layer, and the second gate stack is disposed within the third III-N semiconductor layer; or the first gate stack is disposed within the first polarization layer, and the second gate stack is disposed over the third III-N semiconductor layer.

Example 50 includes the subject matter of any of Examples 39-49 and 51-59, wherein the first and second buffer layers each: include at least one of aluminum nitride (AlN), aluminum gallium nitride (AlGaN), titanium nitride (TiN), hafnium nitride (HfN), titanium oxide (TiO), and hafnium oxide (HfO); and have a thickness in the range of about 10-100 nm.

Example 51 includes the subject matter of any of Examples 39-50 and 52-59, wherein the first and second buffer layers together constitute a single, unitary layer that is conformal to the first and second features and the portion of the semiconductor substrate that separates the first and second features.

Example 52 includes the subject matter of any of Examples 39-51 and 53-59, wherein the first and second polarization layers each: include at least one of aluminum indium nitride (AlInN) and aluminum gallium nitride (AlGaN); and have a thickness in the range of about 10-30 nm.

Example 53 includes the subject matter of any of Examples 39-52 and 54-59 and further includes: providing a first interface layer disposed between the first III-N semiconductor layer and the first polarization layer; and providing a second interface layer disposed between the second III-N semiconductor layer and the second polarization layer.

Example 54 includes the subject matter of Example 53, wherein the first and second interface layers each: include aluminum nitride (AlN); and have a thickness in the range of about 0.5-2 nm.

Example 55 includes the subject matter of any of Examples 39-54 and 56-59, wherein the dielectric layer: includes at least one of silicon dioxide ($SiO_2$), aluminum oxide ($Al_2O_3$), hafnium oxide ($HfO_2$), zirconium dioxide ($ZrO_2$), tantalum pentoxide ($Ta_2O_5$), titanium dioxide ($TiO_2$), lanthanum oxide ($La_2O_3$), silicon nitride ($Si_3N_4$), silicon oxynitride (SiON), and silicon carbide (SiC); and has a thickness in the range of about 50-150 nm.

Example 56 includes the subject matter of any of Examples 39-55 and 57-59, wherein: the first III-N semiconductor layer and the first polarization layer interface such that a two-dimensional electron gas (2DEG) exists at their interface, and the n-channel transistor device is configured to use the 2DEG as its channel; and the second polarization layer and the third III-N semiconductor layer interface such that a two-dimensional hole gas (2DHG) exists at their interface, and the p-channel transistor device is configured to use the 2DHG as its channel.

Example 57 includes the subject matter of any of Examples 39-56 and 58-59, wherein the semiconductor substrate includes silicon (Si).

Example 58 includes the subject matter of any of Examples 39-57 and 59, wherein the semiconductor substrate includes silicon (Si) having a crystal orientation of <111>.

Example 59 includes the subject matter of any of Examples 39-58, wherein the portion of the semiconductor substrate that separates the first and second features at least one of: is oxidized; and has a sidewall portion that is slanted with respect to a bottom surface of at least one of the first and second features.

Example 60 is an integrated circuit including: a silicon (Si) substrate; a dielectric layer disposed over the Si substrate; first and second recessed trenches disposed in the Si substrate, under corresponding first and second openings disposed in the dielectric layer, wherein the first and second recessed trenches are separated from one another by a prominence extending from the Si substrate; first and second buffer layers disposed on the semiconductor substrate, within the first and second recessed trenches, respectively; first and second gallium nitride (GaN) or indium gallium nitride (InGaN) layers disposed on the first and second buffer layers, respectively, within the first and second recessed trenches, respectively; first and second aluminum gallium nitride (AlGaN) or indium aluminum nitride (InAlN) layers disposed over the first and second GaN or InGaN layers, respectively, within the first and second recessed trenches, respectively, and extending through the first and second openings, respectively, of the dielectric layer such that at least a portion of each of the first and second AlGaN or InAlN layers is co-planar with an upper surface of the dielectric layer; and a third GaN or InGaN layer disposed over the at least a portion of the second AlGaN or InAlN layer that is co-planar with the upper surface of the dielectric layer.

Example 61 includes the subject matter of any of Examples 60 and 62-69 and further includes: n-type source/drain (S/D) portions disposed over the first GaN or InGaN layer and extending through the first AlGaN or InAlN layer and the dielectric layer; S/D contacts disposed over the n-type S/D portions; p-type S/D portions disposed over the dielectric layer, extending from sidewalls of the third GaN or InGaN layer; and S/D contacts disposed over the p-type S/D portions.

Example 62 includes the subject matter of any of Examples 60-61 and 63-69, wherein the p-type S/D portions extend from either m-plane or a-plane sidewalls of the third III-N semiconductor layer.

Example 63 includes the subject matter of any of Examples 60-62 and 64-69 and further includes: a first gate stack disposed over the first GaN or InGaN layer; and a second gate stack disposed over the second GaN or InGaN layer; wherein either: the first gate stack is disposed within the first AlGaN or InAlN layer, and the second gate stack is disposed within the third GaN or InGaN layer; the first gate stack is disposed over the first AlGaN or InAlN layer, and the second gate stack is disposed over the third GaN or InGaN layer; the first gate stack is disposed over the first AlGaN or InAlN layer, and the second gate stack is disposed within the third GaN or InGaN layer; or the first gate stack is disposed within the first AlGaN or InAlN layer, and the second gate stack is disposed over the third GaN or InGaN layer.

Example 64 includes the subject matter of any of Examples 60-63 and 65-69, wherein the first and second buffer layers together constitute a single, unitary layer that is conformal to the first and second recessed trenches and the prominence extending from the Si substrate.

Example 65 includes the subject matter of any of Examples 60-64 and 66-69 and further includes: a first aluminum nitride (AlN) layer disposed between the first GaN or InGaN layer and the first AlGaN or InAlN layer; and a second AlN layer disposed between the second GaN or InGaN layer and the second AlGaN or InAlN layer.

Example 66 includes the subject matter of any of Examples 60-65 and 67-69, wherein the prominence extending from the Si substrate at least one of: is oxidized; and has a sidewall portion that is not perpendicular with respect to a bottom surface of at least one of the first and second recessed trenches.

Example 67 is a power management integrated circuit (PMIC) including the subject matter of any of Examples 60-66.

Example 68 is a radio frequency (RF) power amplifier including the subject matter of any of Examples 60-66.

Example 69 is a voltage regulator power train including the subject matter of any of Examples 60-66.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   an n-type transistor including
      a first layer comprising an oxide and/or a nitride,
      a second layer over the first layer, the second layer distinct from the first layer and comprising nitrogen and at least one of gallium and indium, and
      a third layer over the second layer, the third layer distinct from the second layer and comprising nitrogen and at least one of aluminum, gallium, and indium; and
   a p-type transistor adjacent to the n-type transistor, and including
      a fourth layer comprising an oxide and/or a nitride,
      a fifth layer over the fourth layer, the fifth layer distinct from the fourth layer and comprising nitrogen and at least one of gallium and indium,
      a sixth layer over the fifth layer, wherein at least a portion of the sixth layer is co-planar with at least a portion of the third layer, the sixth layer distinct from the fifth layer and comprising nitrogen and at least one of aluminum, gallium, and indium, and
      a seventh layer over the sixth layer, the seventh layer distinct from the sixth layer and comprising nitrogen and at least one of gallium and indium.

2. The integrated circuit of claim 1, further comprising a substrate, the first and fourth layers being over the substrate, wherein at least one of:
   the substrate comprises silicon (Si) having a crystal orientation of <111>; and
   second, fifth, and seventh layers each comprise at least one of gallium nitride (GaN) and indium gallium nitride (InGaN).

3. The integrated circuit of claim 1 further comprising:
   an n-type source portion and an n-type drain portion, each of the n-type source and drain portions over the second layer and extending through the third layer;
   first and second contacts over the n-type source and drain portions, respectively, and comprising at least one of titanium (Ti), aluminum (Al), and tungsten (W);
   a p-type source portion and a p-type drain portion, each of the p-type source and drain portions extending from sidewalls of the seventh layer; and
   third and fourth contacts over the p-type source and drain portions, respectively, and comprising at least one of nickel (Ni), gold (Au), and platinum (Pt).

4. The integrated circuit of claim 3, wherein at least one of:
   the n-type source and drain portions:
      comprise at least one of gallium nitride (GaN) and indium gallium nitride (InGaN); and
      are doped with silicon (Si); and
   the p-type source and drain portions:
      extend from either m-plane or a-plane sidewalls of the seventh layer;
      comprise at least one of gallium nitride (GaN), indium gallium nitride (InGaN), and silicon carbide (SiC); and
      are doped with magnesium (Mg).

5. The integrated circuit of claim 1 further comprising:
   a first gate stack over the second layer; and
   a second gate stack over the fifth layer;
   wherein either:
      the first gate stack is within the third layer, and the second gate stack is within the seventh layer;
      the first gate stack is over the third layer, and the second gate stack is over the seventh layer;
      the first gate stack is over the third layer, and the second gate stack is within the seventh layer; or
      the first gate stack is within the third layer, and the second gate stack is over the seventh layer.

6. An integrated circuit comprising:
   a semiconductor substrate;
   a dielectric layer over the semiconductor substrate;
   first and second features in the semiconductor substrate, under corresponding first and second openings in the dielectric layer, wherein:
      the first and second openings are narrower in width than the first and second features, respectively; and
      the first and second features are separated by a portion of the semiconductor substrate;
   an n-channel transistor device comprising:
      a first buffer layer over the semiconductor substrate, within the first feature;
      a first III-N semiconductor layer over the first buffer layer, within the first feature; and
      a first polarization layer over the first III-N semiconductor layer, within the first feature and extending through the first opening such that at least a portion of the first polarization layer is co-planar with an upper surface of the dielectric layer; and
   a p-channel transistor device comprising:
      a second buffer layer over the semiconductor substrate, within the second feature;

a second III-N semiconductor layer over the second buffer layer, within the second feature;

a second polarization layer over the second III-N semiconductor layer, within the second feature and extending through the second opening such that at least a portion of the second polarization layer is co-planar with the upper surface of the dielectric layer; and a third III-N semiconductor layer over the at least a portion of the second polarization layer that is co-planar with the upper surface of the dielectric layer.

7. The integrated circuit of claim 6, wherein the first, second, and third III-N semiconductor layers each comprise nitrogen and at least one of gallium and indium.

8. The integrated circuit of claim 6 further comprising:

an n-type source portion and an n-type drain portion, the n-type source and drain portions over the first III-N semiconductor layer and extending through the first polarization layer and the dielectric layer;

first and second contacts over the n-type source and drain portions, respectively;

a p-type source portion and a p-type drain portion, the p-type source and drain portions over the dielectric layer, extending from sidewalls of the third III-N semiconductor layer; and third and fourth contacts over the p-type source and drain portions.

9. The integrated circuit of claim 8, wherein at least one of:

the n-type source and drain portions:
  comprise at least one of gallium nitride (GaN) and indium gallium nitride (InGaN); and
  are doped with silicon (Si); and the p-type source and drain portions:
  extend from either m-plane or a-plane sidewalls of the third III-N semiconductor layer;
  comprise at least one of gallium nitride (GaN), indium gallium nitride (InGaN), and silicon carbide (SiC); and
  are doped with magnesium (Mg).

10. The integrated circuit of claim 9, wherein the dielectric layer physically separates the n-type source and drain portions from the at least a portion of the first polarization layer that is co-planar with the upper surface of the dielectric layer.

11. The integrated circuit of claim 6 further comprising:
a first gate stack over the first III-N semiconductor layer; and
a second gate stack over the second III-N semiconductor layer;
wherein:
  the first gate stack is within the first polarization layer, and the second gate stack is within the third III-N semiconductor layer; or
  the first gate stack is over the first polarization layer, and the second gate stack is over the third III-N semiconductor layer; or
  the first gate stack is over the first polarization layer, and the second gate stack is within the third III-N semiconductor layer; or
  the first gate stack is within the first polarization layer, and the second gate stack is over the third III-N semiconductor layer.

12. The integrated circuit of claim 6, wherein the first and second buffer layers together constitute a single, unitary layer that is conformal to the first and second features and the portion of the semiconductor substrate that separates the first and second features.

13. The integrated circuit of claim 6, wherein the semiconductor substrate comprises silicon (Si) having a crystal orientation of <111>.

14. The integrated circuit of claim 6, wherein the portion of the semiconductor substrate that separates the first and second features at least one of:
  is oxidized; and
  has a sidewall portion that is slanted with respect to a bottom surface of at least one of the first and second features.

15. An integrated circuit comprising:
a substrate comprising silicon;
a dielectric material over the substrate;
first and second trenches in the substrate, under corresponding first and second openings in the dielectric material, wherein the first and second trenches are separated from one another by a prominence extending from the substrate;
first and second layers on the substrate, within the first and second trenches, respectively, the first and second layers comprising a nitride and/or an oxide;
third and fourth layers on the first and second layers, respectively, within the first and second trenches, respectively, the third and fourth layers comprising nitrogen and at least one of gallium and indium;
fifth and sixth layers distinct from and over the third and fourth layers, respectively, within the first and second trenches, respectively, and extending through the first and second openings, respectively, such that at least a portion of each of the fifth and sixth layers is co-planar with an upper surface of the dielectric material, the fifth and sixth layers comprising nitrogen, aluminum, and at least one of gallium and indium; and
a seventh layer distinct from and over the at least a portion of the fifth and sixth layers that are co-planar with the upper surface of the dielectric material.

16. The integrated circuit of claim 15 further comprising:
an n-type source portion and an n-type drain portion, the n-type source and drain portions over the third layer and extending through the fifth layer and the dielectric material;
a first contact and a second contact over the n-type source and drain portions, respectively;
a p-type source portion and a p-type drain portion, the p-type source and drain portions over the dielectric material, extending from sidewalls of the seventh layer; and
a third contact and a fourth contact over the p-type source and drain portions, respectively.

17. The integrated circuit of claim 16, wherein the p-type source and drain portions extend from either m-plane or a-plane sidewalls of the seventh layer.

18. The integrated circuit of claim 15, wherein the first and second layers together constitute a single, unitary layer that is conformal to the first and second trenches and the prominence extending from the substrate.

19. The integrated circuit of claim 15 further comprising:
an eighth layer distinct from and between the third layer and the fifth layer, the eighth layer comprising nitrogen and aluminum; and
a ninth layer distinct from and between the fourth layer and the sixth layer, the ninth layer comprising nitrogen and aluminum.

20. The integrated circuit of claim 15, wherein the prominence extending from the substrate at least one of:
   is oxidized; and
   has a sidewall portion that is not perpendicular with respect to a bottom surface of at least one of the first and second trenches.

\* \* \* \* \*